United States Patent
Gandikota et al.

(10) Patent No.: US 6,362,099 B1
(45) Date of Patent: Mar. 26, 2002

(54) METHOD FOR ENHANCING THE ADHESION OF COPPER DEPOSITED BY CHEMICAL VAPOR DEPOSITION

(75) Inventors: Srinivas Gandikota, Santa Clara; Dennis Cong, Sunnyvale; Liang Chen, Foster City; Sesh Ramaswami, Saratoga; Daniel Carl, Pleasanton, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/265,290

(22) Filed: Mar. 9, 1999

(51) Int. Cl.[7] ............................ H01L 23/22; H01L 23/24
(52) U.S. Cl. ........................................ 438/687; 438/653
(58) Field of Search ............................ 438/627, 628, 438/653, 654, 650, 686, 687; 257/762, 751

(56) References Cited

U.S. PATENT DOCUMENTS

| | | | |
|---|---|---|---|
| 5,186,718 A | | 2/1993 | Tepman et al. ............ 29/25.01 |
| 5,236,868 A | | 8/1993 | Nulman ....................... 437/190 |
| 5,320,728 A | | 6/1994 | Tepman .................. 204/192.12 |
| 5,969,422 A | * | 10/1999 | Ting et al. |
| 6,069,068 A | * | 5/2000 | Rathore et al. |
| 6,121,149 A | * | 9/2000 | Lukanc et al. |
| 6,140,241 A | * | 10/2000 | Shue et al. |
| 6,147,000 A | * | 11/2000 | You et al. |
| 6,160,315 A | * | 12/2000 | Chiang et al. |

OTHER PUBLICATIONS

B.N. Chapman, "Thin–film adhesion", *J. Vac. Sci. Technol.*, vol. 11 (1974), p. 106.

M.A. George et al., "Chemical Vapor Etching of Copper for Cu CVD Chamber Cleaning", *Advanced Metallization & Interconnect Systems for ULSI Applications*, Conference Programs & Abstract (1997).

T. Kruck and M. Schober, "Low–temperature dry etching of copper using a new chemical approach", *Microelectronic Engineering*, 37/38 (1997), pp. 121–126.

C. Ryu, "Microstructure and Reliability of Copper Interconnects", Doctoral Thesis, Stanford University (Jun. 1998).

P.A. Steinmann and H. E. Hintermann, *J. Vac. Sci. Technol.* A, vol. 7 (1989), p. 2267.

* cited by examiner

*Primary Examiner*—Sheila V. Clark
(74) *Attorney, Agent, or Firm*—Shirley L. Church; Kathi Bean

(57) ABSTRACT

The present invention provides a method for improving the adhesion of copper and other metal-comprising conductive metals to a barrier layer. A barrier layer is provided that has a first surface that is substantially unoxidized, wherein at least a portion of the first surface is free from the presence of oxygen atoms. A conductive layer is then deposited onto the first surface of the barrier layer. The substantially unoxidized state of the first surface enhances the adhesion of the metal-comprising layer to the barrier layer. The method is particularly useful in obtaining excellent adhesion of a copper nucleation layer to an underlying barrier layer surface.

3 Claims, 6 Drawing Sheets

METHOD FOR ENHANCING THE ADHESION OF COPPER DEPOSITED BY CHEMICAL VAPOR DEPOSITION

BACKGROUND OF THE INVENTION

1. Field of the Invention

The present invention relates generally to a metallization process for manufacturing semiconductor devices. More particularly, the present invention relates to the use of barrier layers having enhanced adhesion to overlying conductive films of copper and other conductive materials.

2. Background

Multilevel metal interconnects having a dimension smaller than 0.20 microns are expected to play a key part in achieving ultra large scale integration (ULSI), which is the next generation of very large scale integration (VLSI). It is also expected that the Damascene process, which involves the deposition of metal into patterned dielectric openings, followed by subsequent chemical-mechanical polishing (CMP) to provide planarization, will also play a key part in achieving such multilevel metal interconnects. As a result, there is a need for a method to reliably deposit metal into patterned dielectric trenches, and to do so in a way that leads to interconnects having desirable properties. The Damascene process is described in Ryu, C., "Microstructure and Reliability of Copper Interconnects," doctoral thesis, Stanford University (June 1998), which is hereby incorporated by reference.

Aluminum (Al) has been widely used as an interconnect metal because of its good electrical properties. Preferred, known procedures for depositing Al interconnects include chemical vapor deposition (CVD) and physical vapor deposition (PVD). CVD is a preferred procedure for depositing Al into high aspect ratio features of the kind found in Damascene processes, because it leads to good conformal layers of Al, i.e., layers that have a uniform thickness over the substrate surface even when the topography of the surface includes a base and sidewalls requiring step coverage, such as in a trench or contact via. It is known to fabricate Al interconnects by depositing Al by CVD at relatively low temperatures into apertures smaller than 0.5 microns.

However, as device sizes continue to shrink while device densities, chip sizes, and maximum interconnect length increase, the limitations of Al become increasingly apparent. In particular, interconnects having a width smaller than about 0.18 microns are desirable for the next generation of integrated circuits. However, at this dimension, the electromigration of aluminum can cause failures in the interconnect. The resistivity of Al also leads to unacceptably high resistances for long interconnects, which can lead to RC delay, i.e., a delay due to the time required for the energy stored in an interconnect to dissipate. Accordingly, new metals are needed to satisfy the requirements of the next generation of integrated circuits.

Copper (Cu) is currently being investigated as a replacement for aluminum in interconnects. Ryu, which was previously incorporated by reference, provides a review of the current state of the art with respect to copper interconnects. Cu has a bulk resistivity of 1.67 $\mu\Omega$-cm, which is approximately 40% less than that of Al (2.66 $\mu\Omega$-cm). Also, Cu exhibits resistance to electromigration superior to that of Al under similar circumstances, and lower RC delay. Thus, the lower resistivity of Cu accommodates a higher line density, i.e., a smaller width, while allowing for increased device speed.

Copper interconnects may be deposited by a variety of conventional procedures, such as physical vapor deposition (PVD), electroplating, and electroless plating. Chemical vapor deposition (CVD) is a viable method due to its superior step coverage and selective deposition capability. CVD involves the formation of a reaction product, copper in this case, on a substrate by thermal reaction or decomposition of gaseous compounds, referred to as precursors. Metal-organic CVD (MOCVD), which uses one or more organo-metallic precursors, is preferred for the CVD of copper because they may be used at relatively low temperatures. Preferred organo-metallic precursors include $Cu^{+2}(hfac)_2$ and $Cu^{+2}(fod)_2$, where hfac is an abbreviation for the hexafluoroacetylacetonate anion, and fod is an abbreviation for heptafluoro dimethyl octanediene.

A preferred process uses the volatile liquid complex $copper^{+1}(hfac)(tmvs)$ an a precursor, where tmvs is an abbreviation for trimethylvinylsilane, with argon as a carrier gas. Because this precursor is a liquid under ambient conditions, it can be utilized in standard CVD bubbler precursor delivery systems currently used in semiconductor fabrication. The deposition reaction is believed to proceed on a heated substrate according to the following mechanism, in which (s) denotes interaction with a surface and (g) denotes the gas phase.

(1) $2Cu^{+1}(hfac)(tmvs)(g) \rightarrow 2Cu^{+1}(hfac)(tmvs)(s)$
(2) $2Cu^{+1}(hfac)(tmvs)(s) \rightarrow 2Cu^{+1}(hfac)(s)+2(tmvs)(g)$
(3) $2Cu^{+1}hfac(s) \rightarrow Cu(hfac)(s)+Cu^{+2}(hfac)_2(s)$
(4) $Cu(hfac)(s)+Cu^{+2}(hfac)(s) \rightarrow Cu(s)+Cu^{+2}(hfac)_2(s)$ In step 1, the precursor is adsorbed from the gas phase onto a metallic surface. In step 2, the precursor is dissociated to $2Cu^{+1}(hfac)$ and 2 (tmvs). (tmvs) leaves the surface by desorption. In step 3, Cu(hfac) and $Cu^{+2}(hfac)_2$ are generated by electron exchange between surface $Cu^{+1}(hfac)$ species. In step 4, copper metal and volatile $Cu^{+2}(hfac)_2$ are formed by the migration of (hfac) groups. $Cu^{+2}(hfac)_2$ leaves the surface by desorption, leaving copper metal. The overall disproportionation reaction is described by the following equation:

$$2Cu^{+1}(hfac)(tmvs)(g) \rightarrow Cu(s)+Cu^{+2}(hfac)_2(g)+2(tmvs)(g)$$

Both tmvs and $Cu^{+2}(hfac)_2$ are volatile byproducts of the deposition reaction that are exhausted from the chamber. $Cu^{+2}(hfac)_2$ does not contribute to further deposition because the temperature is much lower than that required for $Cu^{+2}(hfac)_2$ decomposition.

$Cu^{+1}(hfac)(tmvs)$ can be used as a precursor to deposit Cu through either a thermal process, or a plasma based process, referred to as plasma enhanced CVD (PECVD). The substrate is preferably held at a temperature between about 100 and 400° C. for PECVD of Cu from $Cu^{+1}(hfac)(tmvs)$. The substrate is preferably held at a temperature between about 150 and 220° C., and more preferably at about 170° C., for CVD of Cu from $Cu^{+1}(hfac)(tmvs)$ that is not plasma enhanced. Lower temperatures result in a very slow deposition rate, and higher temperatures may adversely affect the resistivity of the resultant interconnect. Thermal CVD is typically preferred over PECVD due to the lower temperatures typically involved with thermal CVD.

However, copper may diffuse into surrounding dielectric or insulating layers, as well as the underlying silicon substrate, and interfere with the desirable properties of those layers. This problem also exists with aluminum, and it is known to use a barrier layer to separate such interconnects from other features. Barrier layers for aluminum interconnects are commonly made from materials that include tantalum (Ta), tantalum nitride (TaN), titanium (Ti), and titanium nitride (TiN). It is also known to use a barrier layer to separate copper interconnects from other features. Barrier layers used to separate copper interconnects from other features include those listed above for use with aluminum interconnects. However, while the interaction between these barrier layers and aluminum has been intensively studied, the interaction with Cu may be different. In particular, there is often poor adhesion between barrier layers and the copper interconnects deposited on the barrier layers, which may lead to dewetting and device failures due to high via resistance and poor electromigration reaistance. This problem is particularly pronounced with Cu interconnects deposited by CVD, but may also exist to a lesser extent with Cu deposited by other methods, such as PVD, electroplating, and electroless plating. In addition, an improper selection of a barrier layer may lead to problems with the growth of the copper interconnect, interfacial contamination, and/or an undesirable microstructure in the copper. With respect to CVD, efforts at solving these problems have largely been directed to attempts to prevent chlorine and fluorine present in the precursors from incorporating into the copper films.

Layers of Cu deposited by PVD have typically demonstrated better adhesion to conventional barrier layers than layers of Cu deposited by CVD. However, CVD is preferred over PVD for other reasons, such as superior trench and via fill. To take advantage of the favorable properties of both CVD and PVD, it is known to deposit a seed layer of Cu by PVD for good adhesion to the underlying barrier layer, followed by the deposition of Cu by CVD to achieve superior trench and via fill. However, using both CVD and PVD requires extra process steps which increases manufacturing time and cost. It is also known to anneal CVD deposited Cu after deposition to enhance adhesion. See id.

SUMMARY OF THE INVENTION

The present invention provides a method for improving the adhesion of copper and other conductive metals to a substrate, such as a barrier layer. A barrier layer is provided that has a first surface that is substantially unoxidized. A copper layer is then deposited onto the first surface of the barrier layer. The substantially unoxidized state of the first surface enhances the adhesion of the copper layer to the barrier layer. The substantially unoxidized first surface of the barrier layer may be provided by preventing oxidation of the barrier layer subsequent to its deposition, or by removing or displacing oxidation from at least a portion of the barrier layer surface prior to deposition of the conductive metal. Further, an adhesion promoting material may be added to the barrier layer which ensures that at least a portion of the barrier surface remains free from oxidation. In the case of copper, the copper may be deposited by a variety of processes, including chemical vapor deposition (CVD), physical vapor deposition (PVD), electroless plating, and electroplating, for example.

The substantially unoxidized first surface of a barrier layer may be provided by including a noble metal in the barrier layer. This noble metal may be selected from the group consisting of gold (Au), silver (Ag), platinum (Pt), chromium (Cr), nickel (Ni), and palladium (Pd), for example. The barrier layer may consist essentially of the noble metal, or may be doped with the noble metal, so that at least a portion of the surface of the barrier layer will not be oxidized. The barrier layer may include an adhesion promotion layer of the noble metal. The noble metal may be added to the barrier layer by ion implantation and other techniques known in the art.

The substantially unoxidized first surface may also be provided by including a refractory metal that forms a volatile oxide at the barrier layer surface, using the techniques described above with reference to noble metals. This refractory metal may be selected from the group consisting of tungsten (W) and molybdenum (Mo), for example, but not by way of limitation.

The environment to which the barrier layer is exposed may also be controlled to minimize oxidation prior to application of the metal-comprising interconnect material. For example, the deposition of copper may be started while the deposition of the barrier layer is still proceeding. When the copper is deposited by CVD, the material of the barrier layer may be incorporated into the precursor during at least the first portion of the CVD deposition. Oxidation of the barrier layer during the deposition of copper by chemical vapor deposition (CVD) may be avoided by using a precursor that is substantially free of water.

The substantially unoxidized first surface may be provided by removing oxide from the surface of the barrier layer using techniques such as ion bombardment, chemical reaction to produce a volatile species, and contact with a displacing material, for example, and not by way of limitation.

DETAILED DESCRIPTION OF THE INVENTION

Figure 1:
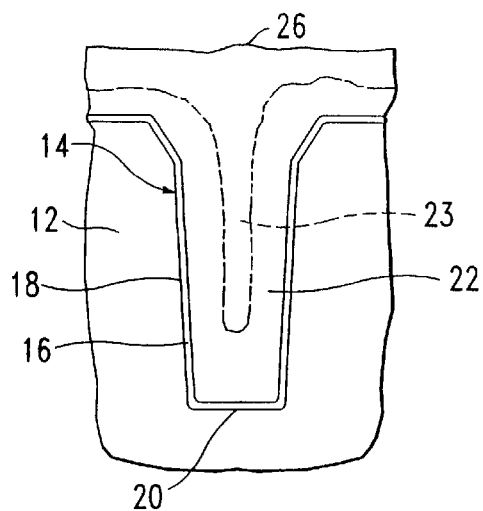
FIG. 1 shows a metallization geometry useful for Cu interconnects in accordance with the present invention.

The present invention provides a copper interconnect having excellent adhesion to an underlying barrier layer. While not intending to be limited by the theory as to how the present invention works, the inventors believe that poor adhesion between metal-comprising interconnect depositions and barrier layers is typically caused by oxidation present on the surface of conventional barrier layers fabricated by conventional methods. This oxidation appears to be especially harmful when copper is the metal-comprising interconnect material.

1. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, and reference to "copper" includes alloys thereof.

Specific terminology of particular importance to the description of the present invention is defined below.

The term "aspect ratio" refers to, but is not limited to, the ratio of the height dimension to the width dimension of a particular feature. When the feature has more than one width dimension, the aspect ratio is typically calculated using the smallest width dimension of the feature. For example, a contact via opening which typically extends in a tubular form through multiple layers has a height and a diameter, and the aspect ratio would be the height of the tubular divided by the diameter. The aspect ratio of a trench would be the height of the trench divided by the minimal width of the trench, which typically occurs at its base.

The term "copper" refers to copper and alloys thereof, wherein the copper content of the alloy is at least 80 atomic %. The alloy may comprise more than two elemental components.

The term "decoupled plasma source" refers to a plasma generation apparatus which has separate controls for power input to a plasma source generator and to a substrate bias device. The substrate bias voltage affects the ion bombardment energy on the substrate surface. This decoupled plasma source typically incorporates measures to separate (decouple) the influence of the plasma source power and bias power on one another.

The term "feature" refers to, but is not limited to, contacts, vias, trenches, and other structures which make up the topography of the substrate surface.

The term "FWHM" refers to a commonly reported indication of aluminum texture. The FWHM is obtained from an X-ray diffraction "Rocking Curve", which is a measurement obtained by rotating (rocking) a sample through the specified Bragg angles of its phases while the X-ray detector is fixed at 2θ. The FWHM, expressed in degrees, represents the number of degrees spanned by the width of the curve at half its maximum height. A wider curve, spanning a larger number of degrees, indicates that the crystallographic orientation of interest is not highly textured. A narrow curve, spanning a limited number of degrees is a strong signal, indicating a larger quantity of the crystallographic orientation of interest (a high texture). The FWHM measurement is preferred over the diffraction intensity, since it is less sensitive to the measurement variables and is a direct indicator of the degree of texture for a given sample. The Rocking Curve has become a standard indicator of electromigration resistance for a deposited aluminum film, since electromigration is directly related to crystallographic orientation of the aluminum.

The term "high density plasma sputter deposition" refers to, but is not limited to a sputter deposition (preferably a magnetron sputter deposition), where a high density, inductively coupled RF plasma is created between the sputtering cathode and the substrate support electrode, whereby at least a portion of the sputtered emission is in the form of ions at the time it reaches the substrate surface.

The term "SIMS" refers to a secondary ion mass spectrometer.

The term "traditional sputtering" refers to a method of forming a film layer on a substrate wherein a target is sputtered and the material sputtered from the target passes between the target and the substrate to form a film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of target material which is ionized is less than 10%, more typically less than 1%, of that sputtered from the target.

The term "XPS" refers to X-ray photo electron spectroscopy.

2. An Apparatus for Practicing the Invention

Figure 2:
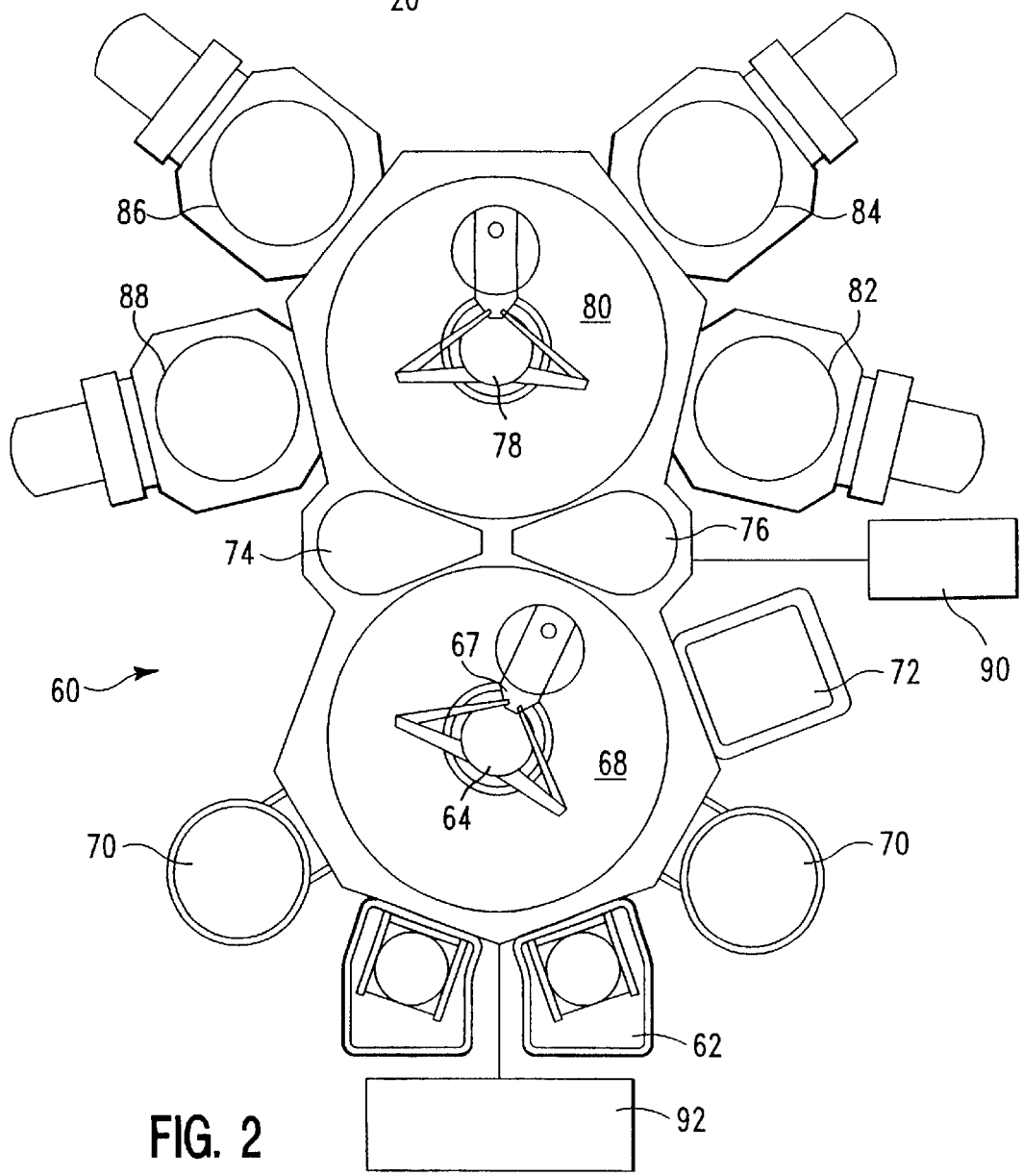
FIG. 2 shows a diagram of an exemplary integrated cluster tool of the kind useful in controlling the ambient to which a substrate surface is exposed during the PVD deposition of barrier layers and the CVD deposition of metal-comprising interconnect layers.

A process system which can be used to carry out substrate pre-cleaning steps (typically ion bombardment), the deposition of barrier layers and the deposition of copper seed layers is the ENDURA® Integrated Processing System available from Applied Materials, Inc. (Santa Clara, Calif.) The system is shown and described in U.S. Pat. Nos. 5,186,718 and 5,236,868, the disclosures of which are incorporated by reference. FIG. 2 shows one configuration of an ENDURA® Integrated Processing System 3. Preferred Embodiments of the Present Invention With respect to Cu deposited by CVD using copper$^{+1}$ (hfac)(tmvs) as a precursor in particular, the inventors believe that a metallic or electrically conductive barrier layer having a non-oxidized surface facilitates the electron transfer that occurs in step (3) of the deposition reaction described in the background section, while an oxidized barrier layer surface inhibits this electron transfer. It is believed that such oxidation similarly inhibits steps necessary for good adhesion in other deposition processes for Cu, such as PVD, electroplating, and electroless plating. The present invention provides a barrier layer having a substantially unoxidized surface, onto which Cu can be deposited such that there is good adhesion between the Cu and the barrier layer. "Substantially unoxidized" means having a metallic surface that facilitates the deposition of Cu, relative to an oxidized surface. Preferably, the substantially unoxidized surface has less than a single monolayer of oxide. At a minimum, at least portions of the barrier layer surface are free from the presence of oxygen atoms.

There are several ways to provide a barrier layer having a substantially unoxidized surface. A barrier layer material may be chosen that does not oxidize under the conditions to which it will be exposed, using thermodynamic, kinetic, or other criteria. The barrier material may be a noble metal known to be resistant to oxidation under many conditions, such as gold (Au), silver (Ag), platinum (Pt), chromium (Cr), nickel (Ni), and palladium (Pd). The barrier material may be a refractory metal, such as tungsten (W) and molybdenum (Mo), that forms a volatile oxide, i.e., an oxide that vaporizes under vacuum conditions. The barrier may be made of a material that is not necessarily resistant to oxidation, but is doped with a material resistant to oxidation to improve the oxidation resistance of the barrier layer and to ensure the presence of non-oxidized surface areas on the barrier layer. A material resistant to oxidation may also be incorporated into at least the initial portion of the Cu deposition process to enhance adhesion. For example, a noble metal may be incorporated into a precursor used to deposit Cu by CVD.

The environment to which the barrier layer is exposed may also be controlled to minimize oxidation. The preferred embodiment of the present invention includes the use of materials that are not necessarily resistant to oxidation, but where the environment can be controlled to produce a surface substantially free of oxide at the time of Cu deposition. Cu may be deposited shortly after depositing a barrier material, such that there is not time for the barrier material to oxidize. The deposition of Cu may be started before the deposition of the barrier layer is complete, such that the barrier layer has no time to form an oxide, and there is an interface at which Cu is intimately mixed with the material of the barrier layer. A vacuum or a controlled non-oxidizing environment is preferably maintained over the barrier layer until the Cu is deposited, for example by performing the deposition of the barrier layer and the Cu in the same vacuum chamber or in connected vacuum chambers, where the chamber ambients are non-oxidizing and may include a flow-through nonreactive gas which sweeps across the barrier layer surface to prevent oxidation of such surface.

The barrier layer may comprise multiple layers, where the top layer is an adhesion promotion layer onto which the Cu is to be deposited, such that the underlying layers may be fabricated of materials to which Cu may not adhere as well, but which have other desirable properties. Such an adhesion promotion top layer may be fabricated by depositing layers of barrier material in sequence. Alternatively, the barrier layer may include an adhesion-promoting dopant that preferentially migrates to the surface of the barrier layer. An annealing step may be performed to segregate such a dopant to the surface.

The material and method of fabricating the barrier layer are preferably chosen such that the barrier is a conformal layer that prevents diffusion of Cu into surrounding materials, adheres well to the underlying material, has good conductivity, and does not adversely affect the properties of the underlying materials. As a result, some barrier layers and methods that provide a surface substantially free of oxide onto which Cu may be deposited may not be suitable for use in some devices, yet may be suitable for use in others.

Thermodynamic Selection of Suitable Barrier Materials

Some metals are known to be resistant to oxidation under a variety of environments, including environments to which barrier layers are typically exposed. These metals include gold (Au), silver (Ag), platinum (Pt), chromium (Cr), nickel (Ni), and palladium (Pd). Other metals are known to have oxides that are volatile under the vacuum conditions to which barrier layers are exposed, such as tungsten (W) and molybdenum (Mo). Depending upon criteria unrelated to adhesion, such as compatibility with the rest of the device and processing complexity and cost, any of these metals may be preferred for use as a barrier layer, a dopant or component in a barrier layer, and/or an adhesion promotion top layer of a barrier layer.

Thermodynamic criteria may be used to select a material resistant to oxidation for use as a barrier layer. For example, Table 1 shows the Heat of oxide formation for various oxides of materials used in semiconductor fabrication.

TABLE 1

Heat of oxide formation

| Compound | Heat of Formation |
| --- | --- |
| $Al_2O_3$ | −399K cal/mole |
| $Au_2O_3$ | 11K cal/mole |
| CuO | −38.5K cal/mole |
| $Cu_2O$ | −43K cal/mole |
| MgO | −143.84K cal/mole |
| NiO | −58.4K cal/mole |
| PdO | −20.4K cal/mole |
| $SiO_2$ | −202K cal/mole |
| $TiO_2$ | −214K cal/mole |
| $Ta_2O_5$ | −486K cal/mole |

In addition to resistance to oxidation, the conductivity of the barrier layer material may also be considered. Proposed materials and their resistivities include: Au (2.4 $\mu\Omega$-cm), Co (9 $\mu\Omega$-cm), Ni (7 $\mu\Omega$-cm), Pt (10.5 $\mu\Omega$-cm), Pd (10.8 $\mu\Omega$-cm). Typically an acceptable material will have a resistivity of less than about 50 $\mu\Omega$-cm.

Environmental Control to Reduce Oxidation of the Barrier Layer

Depending upon the barrier material used, the amount of oxide that forms on the barrier layer may be sensitive to the environment to which the barrier layer is exposed. Preferably, the barrier material is selected such that significant amounts of oxide do not form under a variety of environments, such that careful control of the environment is not necessary. However, barrier materials that do form oxides may be used within the present invention by controlling the environment to which the barrier layer is exposed. Relevant parameters include the partial pressure of oxygen and/or amount of moisture to which the barrier layer is exposed, the temperature during such exposure, the presence of a non-oxidizing purge gas for removal of oxygen which may be available within the process chamber from various sources, and the duration of exposure prior to the deposition of Cu.

For Cu deposited by CVD, the precursor used to deposit the Cu may affect the oxidation of the barrier material. For example, the commonly used β-diketonate ligand, hfac, is a potential contamination source of oxygen and/or water (as well as fluorine and carbon). Indeed, water is conventionally added to precursors such as copper$^{+1}$(hfac)(tmvs), for example by hydrating the hfac, to increase the Cu deposition rate. The inventors' analysis shows that addition of such water is detrimental to the adhesion of Cu to the barrier layer, because the water oxidizes the surface of the barrier layer onto which the Cu is to be deposited. A precursor that contains only very low amounts of water and oxygen, and that is preferably essentially free of those substances, may be used to reduce oxidation.

The use of a precursor having a low amount of water is contrary to the conventional use of water to enhance CVD deposition rate. However, any oxidation of the barrier layer due to water in the precursor happens before or during the deposition of the first few atomic layers of Cu, i.e., during the first few seconds of the Cu deposition. As a result, good adhesion may be obtained by using a precursor having a reduced amount of water to deposit a nucleation layer of Cu by CVD. Good deposition rates may be then obtained by depositing Cu by CVD using a precursor having more water, or adding water to the same precursor which is used to deposit the nucleation layer of Cu. This process is preferable to the deposition of a nucleation layer by PVD, followed by CVD deposition, because the deposition of Cu is by CVD only, which reduces manufacturing complexity.

Use of Ion Bombardment for Removal of Oxidation from the Barrier Layer Surface

Ion bombardment may be used for "plasma cleaning" or "sputter cleaning" of a barrier layer surface just prior to deposition of a copper nucleation layer. Techniques for ion bombardment of a semiconductor substrate surface are well known in the art and will not be discussed in detail herein. It is also possible to use ion bombardment during the initial application of the copper nucleation layer to further facilitate adhesion of this nucleation layer to an underlying barrier layer surface.

Metallization Geometry

FIG. 1 shows a metallization geometry useful for Cu interconnects in accordance with the present invention. The metallization geometry of FIG. 1 is preferably fabricated in accordance with a DRY FILL™ process provided by Applied Materials, Inc. of Santa Clara, Calif., which includes CVD followed by PVD. A substrate 12, preferably made of a dielectric material, has a via 14 with a high aspect ratio. However, the present invention may be beneficial in cooperation with vias having any aspect ratio. Via 14 has walls 18 and a floor 20. A thin barrier layer 16 is deposited directly onto substrate 12 covering substantially all surfaces, including walls 18 and floor 20 of via 14. The thin barrier layer 16 will generally have a thickness of between about 150 Å and about 1,000 Å. However, because the barrier layer contributes to the overall resistivity of the interconnect, the preferred thickness is in a range of between about 150 Å and about 350 Å. A conformal CVD Cu layer 22 is deposited on the barrier layer 16 to a desired thickness not to exceed the thickness which would seal the top of the contact or via. Barrier layer 16 is fabricated using a material and/or process such that the surface between barrier layer 16 and Cu layer 22 is substantially free of oxide when Cu layer 22 is deposited. A PVD Cu layer 23 is then deposited onto the CVD Cu layer 22. The interface between CVD Cu layer 22 and PVD Cu layer 23 is shown as a dotted line, because the interface should not be apparent after PVD Cu layer 23 is deposited, i.e., CVD Cu layer 22 and PVD Cu layer 23 form a single integrated Cu layer. Top surface 26 of PVD Cu layer 23 may then planarized by known methods, such as chemical mechanical polishing (CMP). The Mirra System available from Applied Materials of Santa Clara, Calif. is one CMP apparatus which may be used to advantage. PVD Cu layer 23 may be doped with dopants such as tin (Sn) to alter the electrical properties of PVD Cu layer 23. The process may be controlled such that these dopants disperse into CVD Cu layer 22 as well, thereby altering the electrical properties of the integrated Cu layer. In general, however, PVD Cu layer 23 does not need to be doped.

Preferred Embodiment Fabrication Apparatus

The methods of the present invention are preferably carried out in an integrated cluster tool that has been programmed to process a substrate accordingly. For example, U.S. Pat. No. 5,186,718, entitled "Staged-Vacuum Wafer Processing System and Method," Tepman et al., issued on Feb. 16, 1993, which is incorporated herein by reference, discloses a one staged-vacuum wafer processing system.

FIG. 2 shows a diagram of an exemplary integrated cluster tool 60. Cluster tool 60 is preferably equipped with a microprocessor controller programmed to carry out the processing methods. Substrates may be introduced into cluster tool 60 through a cassette loadlock 62. A robot 64 having a blade 67 transfers the substrate from cassette loadlock 62 through a buffer chamber 68 to a degas wafer orientation chamber 70 and then to a preclean chamber 72. Degassing and precleaning may be performed in these chambers using techniques known to the art.

Robot 64 then transfers the substrate to a robot 78 located in a transfer chamber 80. Robot 78 positions the substrate in chamber 82, where a barrier layer is deposited in accordance with the present invention. Robot 78 then positions the substrate in a CVD chamber 84, where a Cu layer such as Cu layer 22 of FIG. 1 is deposited by CVD. Robot 78 then positions the substrate in a PVD chamber 86, where a PVD Cu layer such as PVD Cu layer 23 of FIG. 1 is deposited by PVD. The substrate is then passed back through the transfer chamber 80, cooldown chamber 76 and buffer chamber 68 for removal through loadlock 62. The substrate may then be polished in a chemical mechanical polishing apparatus (not shown) for planarization, using techniques known to the art.

During the above described fabrication steps, the substrate may be processed or cooled in one or more chambers any number of times in any order to accomplish fabrication of the desired structure on the substrate. The exact arrangement and combination of chambers may be altered for purposes of performing specific steps of a fabrication process.

The foregoing is merely illustrative of a possible processing sequence; other sequences may be performed according to the present invention. For example, for the fabrication of a traditional barrier layer such as a Ta barrier layer, having an adhesion promotion layer in accordance with the present invention, the substrate may be delivered to an IMP chamber 88 for deposition of Ta, then to PVD chamber 86 for deposition of an adhesion promotion layer of Ni or Pt, for example, prior to the deposition of Cu layers.

Cu Deposited by PVD, Electroless Plating, and Electroplating

The foregoing description has focused primarily on barrier layers for use with CVD Cu. However, the barrier layers of the present invention may be used to advantage with any method of depositing Cu where the oxidation or conductivity of the surface onto which the Cu is deposited affects the deposition or adhesion of the Cu, or an electron transfer on a conductive surface occurs in one of the reaction steps. These methods include PVD, electroplating, and electroless plating. For example, electroplating Cu fill and electroless plating of Cu both involve electron transfer on a conducting surface.

In electroless Cu plating, Cu atoms are supplied to a film surface by catalytic reduction of aqueous Cu ions. The electrons for the Cu reduction are provided by the oxidation of a reducing agent in the deposition bath. The oxidation of the reducing agent, in turn, is catalyzed only on conductive surfaces. A typical Cu electroless process is represented by the following equation:

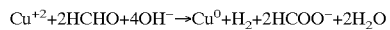

$$Cu^{+2}+2HCHO+4OH^- \rightarrow Cu^0+H_2+2HCOO^-+2H_2O$$

where Cu ions are supplied from a Cu sulfate pentahydrate solution ($CuS_4O.5H_2O$). The conductive surface may be any of the barrier layers of the present invention deposited by any conventional method and as described above.

Cu electroplating affords a number of advantages over electroless plating including superior trench and via fill because the deposition parameters are easily controlled. Cu electroplating typically involves a sulfuric acid plating bath and a Cu sulfate solution. The reaction is a simple dissociation of Cu sulfate and a reduction of Cu ions:

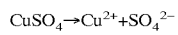

$$CuSO_4 \rightarrow Cu^{2+}+SO_4^{2-}$$

As with CVD Cu and electroless Cu, the reduction of the Cu ions in electroplating requires a conductive surface. The barrier layers of the present invention are ideally suited for this purpose and may be deposited by any known method and as described above. High density plasma sputter deposition is a preferred method of deposition.

EXAMPLES

Example 1

Oxidation of Ta

Several samples were prepared, each having a 200 Å barrier layer of Ta deposited on a substrate having a structured $SiO_2$ layer. The Ta was deposited using a high density plasma sputtering process. Cu was then deposited onto the barrier layers by CVD to a thickness of about 1000 Å. Another Cu layer was then deposited by PVD to a thickness of about 1 micron.

In particular, the Ta barrier layer was deposited using a Vectra™ (Applied Materials, Inc.) high density plasma source. The CVD Cu was deposited using Cupra select (hfac), 2504 blend, Cu (tmvs) precursor supplied by Schumacher, which was delivered to a "shower head" distributor using a direct liquid injection system. The substrate platen (cathode) heater temperature was maintained between 180° C. and about 200° C. The CVD reactor process pressure was maintained at about 1.5 Torr with helium as the carrier gas. The PVD Cu deposition was carried out using a 280 mm target-substrate spacing Cu sputtering source (a long-throw or γ copper source) developed by Applied Materials, Inc.

The conditions to which the Ta barrier later was exposed before the Cu was deposited by CVD were controlled. In particular, the samples were not removed from the vacuum chamber in between processes, and the time between processes and the amount of oxygen in the chamber during that time were controlled as indicated in Table 2. After the PVD Cu was deposited, the adhesion between the CVD Cu and the Ta barrier layer was tested using the common tape test method, using both the blank and scribe tape tests. "Blank" indicates an undisturbed deposition layer, while "scribe" indicates that the layer has been purposefully scarred in order to determine the localized adhesion strength of the CVD Cu layer to the barrier layer. Descriptions of the blank and scribe tape tests are presented in the following articles: B. N. Chapman, J. Vac. Sci. Technol 11 (1974), 106; and P. A. Steinmann and H. E. Hintermann, J. Vac. Sci. Technol. A 7 (1989), 2267.

Table 2 summarizes the results of those tests.

TABLE 2

Effect of Ta Exposure to Various Ambients

| Sample | Exposure | | Tape Test | |
|---|---|---|---|---|
| | Ambient | Time | Blank | Scribe |
| 1. IMP Ta(200 Å)/CVD Cu(1 KÅ)/ PVD Cu(1 μm) | 1E-09 Torr | 0 min | Pass | Pass |
| 2. IMP Ta(200 Å)/CVD Cu(1 KÅ)/ PVD Cu(1 μm) | 1E-09 Torr | 5 min | Pass | Fail |
| 3. IMP Ta(200 Å)/CVD Cu(1 KÅ)/ PVD Cu(1 μm) | 3E-08 Torr | 5 min | Pass | Fail |
| 4. IMP Ta(200 Å)/CVD Cu(1 KÅ)/ PVD Cu(1 μm) | 3E-07 Torr | 5 min | Pass | Fail |
| 5. IMP Ta(200 Å)/CVD Cu(1 KÅ)/ PVD Cu(1 μm) | 1 m Torr | 5 min | Pass | Fail |
| 6. IMP Ta(200 Å)/CVD Cu(1 KÅ)/ PVD Cu(1 μm) | 100 m Torr | 5 min | Fail | Fail |

Table 2 shows that increasing the amount of oxygen to which the Ta barrier layer is exposed weakens the adhesion between the Ta and the CVD Cu, and that oxidation on the surface of the barrier layer decreases the adhesion of a subsequently deposited Cu layer. Table 2 also shows that the adhesion of Cu to Ta may be improved by controlling the conditions to which the Ta barrier layer is exposed prior to the deposition of Cu to minimize the amount of oxide that forms on the surface of the Ta layer. In particular, the adhesion of Cu to Ta was particularly good in Sample 1. While replication of the exact conditions used to fabricate Sample 1 may not be practical in large scale production, the present invention contemplates other, more practical ways of providing a surface of a barrier layer substantially free of oxide onto which Cu may be deposited.

Example 2

Barrier Layer Materials

Several samples were prepared, each having a barrier layer deposited on a substrate having a structured $SiO_2$ layer. The barrier layers were deposited to a thickness of about 200 Å, and were made of various materials as shown in Table 3. The Ta and TaN barrier layers were deposited in an ionized metal plasma (IMP) chamber. The TiN barrier layer was deposited by CVD. The Ni and Pt were deposited using standard, traditional sputtering techniques on a DC magnetron Endura® platform of the kind known in the art. The Ni and Pt substrates were exposed to ambient atmospheric conditions for approximately 2 days prior to CVD Cu deposition.

Cu was then deposited onto the barrier layers by CVD using the same general process parameters and materials described with respect to Example 1. The samples were then tested by the conventional tape test method, as described with respect to Example 1.

Table 3. Tape Test Results on Traditional Barrier Layers

| | Tape Test | |
|---|---|---|
| Sample | Blank | Scribe |
| 1. IMP Ta(200 Å)/CVD Cu(1 KÅ) | Fail | Fail |
| 2. IMP TaN(200 Å)/CVD Cu(1 KÅ) | Fail | Fail |
| 3. CVD TiN(200 Å)/CVD Cu(1 KÅ) | Fail | Fail |
| 4. Ni(200 Å)/CVD Cu(1 KÅ) | Pass | Pass |
| 5. Ni(200 Å)/CVD Cu(4K Å) | Pass | Pass |
| 6. Pt(260 Å)/CVD Cu(1 KÅ) | Pass | Pass |
| 7. Pt(200 Å)/CVD Cu(4K Å) | Pass | Pass |
| 8. Pt(200 Å)/CVD Cu(8K Å) | Pass | Pass |
| 9. IMP Ta(200 Å)/PVD Cu(200 Å)/CVD Cu(1 KÅ) | Pass | Pass |

As can be seen from Table 3, the samples in which Cu was deposited by CVD onto barrier layers made of conventional materials used with Al, such as Ta, TaN, and TiN, failed the tape test. The inventors believe that this failure may be attributed to the formation of an oxidation layer on the barrier layer. Conversely, the samples having barrier layers made of materials that, according to the inventor's analysis, are unlikely to form significant oxide layers passed the tape test. In particular, samples having Ni and Pt barrier layers passed the tape test.

Cu deposited by PVD is apparently less sensitive to oxidation on the surface of the barrier layer to which the Cu is deposited, as shown by Sample 9, in which a PVD Cu layer passed the tape test, However, the inventors analysis shows that the adhesion of Cu deposited by PVD may also be enhanced by the present invention.

Example 3

Adhesion of CVD Cu Using a Low Moisture Precursor

Several samples were prepared, each having a barrier layer deposited on a substrate having a structured $SiO_2$ layer. The barrier layers were deposited to a thickness of about 200 Å, and were made of various materials as shown in Table 4. The Ta, TaN, and TiN barrier layers were deposited in a manner similar to that described for Example 2. The substrates were then exposed to clean room ambient conditions for about 3 minutes while the substrates were transferred from one chamber loadlock to another chamber loadlock through ambient air.

Cu was then deposited onto the barrier layers by CVD from a Cupra Select 2500 blend precursor, available from Schumacher, Carlsbad, Calif. This precursor is formulated to have a low moisture content (below about 2,500 ppm). The temperature during the deposition of Cu was between about 200 and 260° C. The CVD apparatus and general process parameters used were the same as that described with reference to the previous examples. The samples were then tested by the conventional tape test method, as described with respect to Example 1. The results of these tests are summarized in Table 4. Note that when there is no mention of "air" in Table 4, the substrates were moved under a controlled environment at about $10^{-7}$ Torr, at room temperature, over a time period of less than about one minute. Whenever there is a mention of "air", the barrier layers were exposed to clean room ambient for about three minutes during transfer from one chamber to another.

Table 4. Tape Test Results Cu Deposited from a Low Moisture Precursor

| Sample | Tape Test | |
|---|---|---|
| | Blank | Scribe |
| 1. IMP Ta(200 Å)/CVD Cu(1 KÅ) | Pass | Pass |
| 2. IMP TaN(200 Å)/CVD Cu(1 KÅ) | Pass | Pass |
| 3. CVD TiN(200 Å)/air/CVD Cu(1 KÅ) | Pass | Pass |
| 4. IMP TaN(200 Å)/air/CVD Cu(1 KÅ) | Pass | Fail |
| 5. IMP Ta(200 Å)/air/CVD Cu(1 KÅ) | Pass | Fail |
| 6. IMP Ta(200 Å)/CVD Cu(3K Å) | Pass | Pass |
| 7. IMP TaN(200 Å)/CVD Cu(3K Å) | Pass | Pass |
| 8. IMP Ta(200 Å)/PVD Cu(200 Å)/CVD Cu(8K Å) | Pass | Pass |

As can be seen from Table 4, CVD Cu deposited from a low moisture precursor has adhesion to the barrier layer sufficient to pass the tape test under most of the circumstances tested. The only failures were for the scribe test, where the barrier layer had been exposed to air prior to the deposition of Cu. This failure probably occurred because the exposure to air formed enough oxide to inhibit the adhesion of copper, regardless of how little oxide was formed due to moisture in the precursor. It is believed that TiN forms oxide at a lower rate than Ti and TaN, which explains why the TiN sample exposed to air passed the scribe test, while the Ti and TaN samples failed.

Example 4
XPS Analysis of Ta/CVD Cu Interfaces

Two samples were prepared, each having a Ta barrier layer deposited on a substrate having a structured $SiO_2$ layer. The barrier layers were deposited to a thickness of about 250 Å. The Ta barrier layers were deposited in a manner similar to that described for Example 3. The substrates were then transferred to the CVD deposition chamber by passing them through clean room ambient on a wafer holder over a time period of less than about 3 minutes, as described with reference to Example 3. The CVD apparatus and process parameters used for CVD Cu deposition were the same as described with reference to previous examples.

Cu was then deposited onto the barrier layers by CVD using a Cupra Select 2500 blend precursor for one sample, and a Cupra Select 2504 blend for the other, both available from Schumacher.

The primary difference between Cupra 2500 and Cupra 2504 is that Cupra 2500 has a lower moisture content, i.e., Cupra 2504 is basically Cupra 2500 which has been hydrated using a proprietary method of Schumacher. The precise moisture content is not known, but is greater than 2,500 ppm. The sample prepared using the Cupra 2500 precursor passed both the scribe and blank adhesion tests. The sample prepared using the Cupra 2504 precursor failed both adhesion test, showing that the sample prepared with the low moisture precursor had better adhesion between the barrier layer and the Cu.

Figure 3:
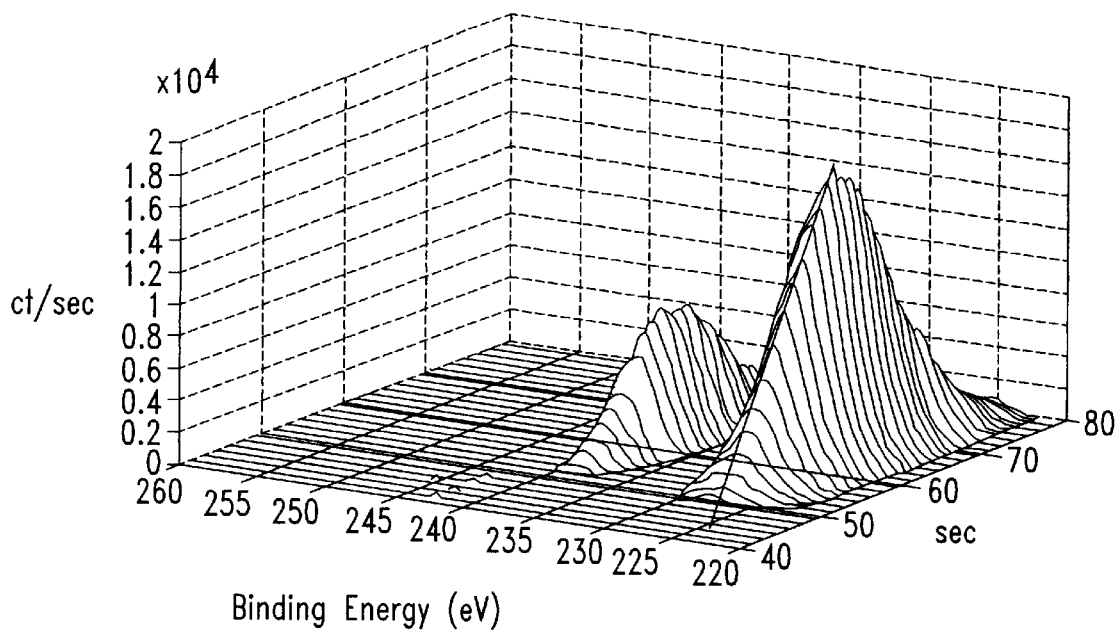
FIG. 3 shows an XPS peak for tantalum for a sample having a Ta barrier layer onto which Cu was deposited using a Cupra 2500 precursor.
Figure 4:
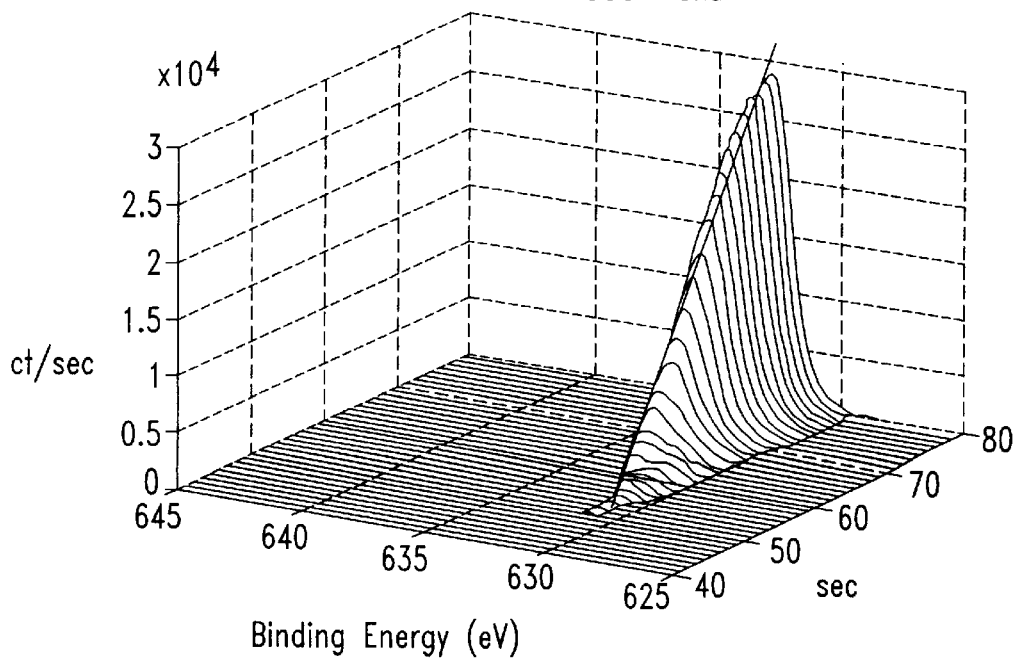
FIG. 4 shows an XPS peak for oxygen for the sample of FIG. 3.
Figure 5:
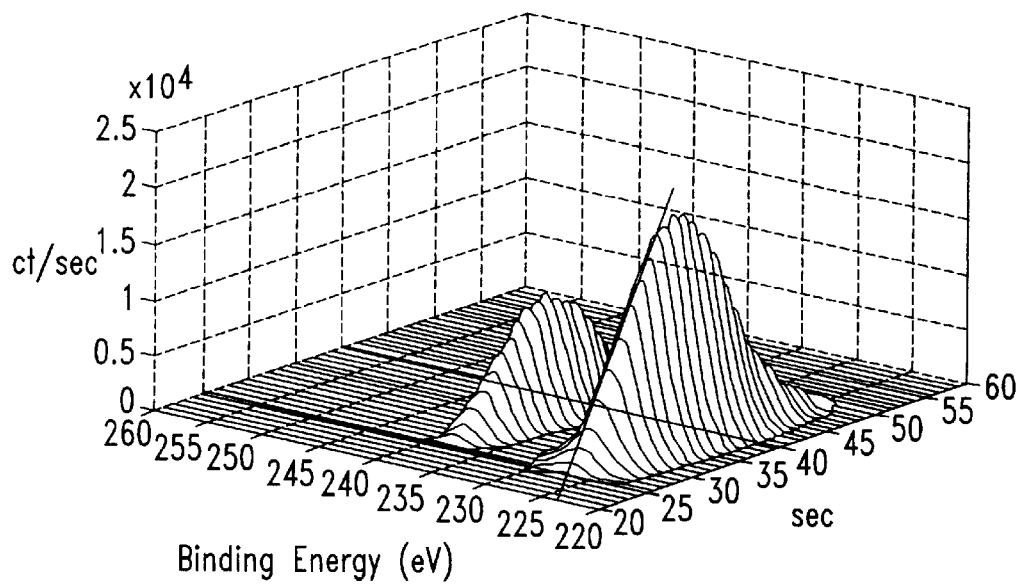
FIG. 5 shows an XPS peak for tantalum in a sample similar to that of FIG. 3, but where the Cu was deposited using a Cupra 2504 precursor.
Figure 6:
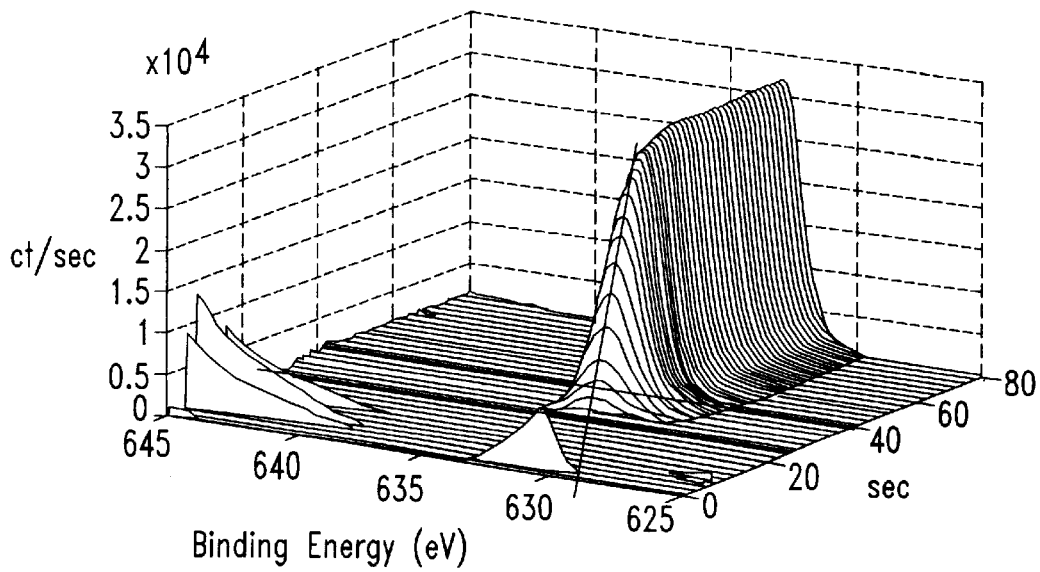
FIG. 6 shows an XPS peak for oxygen for the sample of FIG. 5.

FIGS. 3, 4, 5 and 6 show X-ray photoelectron spectroscopy (XPS) plots for the two samples. FIG. 3 shows an XPS peak for tantalum in the sample prepared using the Cupra 2500 precursor. FIG. 4 shows an XPS peak for oxygen in the sample prepared using the Cupra 2500 precursor. FIG. 5 shows an XPS peak for tantalum in the sample prepared using the Cupra 2504 precursor. FIG. 6 shows an XPS peak for oxygen in the sample prepared using the Cupra 2504 precursor. The "x" axis is the binding energy in eV; the "y" axis is the counts per second; and, the "z" axis is the sputter time in seconds. The plotted tantalum peaks of FIGS. 3 and 5 are Ta4d5 peaks, which are caused by Ta in contact with Cu. The plotted oxygen peaks of FIGS. 4 and 6 are O1s peaks, caused by the presence of oxygen.

A comparison of FIGS. 3 and 4 to FIGS. 5 and 6 show that there is less oxidation at the interface between the copper and the tantalum in the sample prepared with the low moisture precursor Cupra 2500 (FIGS. 3 and 4) than in the sample prepared with the higher moisture precursor Cupra 2504 (FIGS. 5 and 6). In particular, the FWHM signal of FIG. 5 is broader than that of FIG. 3, the oxygen peak of FIG. 4 is shifted with respect to that of FIG. 6. In particular, the FWHM for tantalum from the 50 second sputtering time to the 80 second sputtering time for the 2500 Blend is about 60°, where the FWHM for tantalum from the 25 second sputtering time to the 50 second sputtering time for the 2504 Blend is about 40°. This broadening of the Ta signal FWHM for the Ta surface in contact with the CVD Cu from the 2500 Blend indicates that the Ta surface in contact with CVD Cu from the 2500 Blend is less oxidized than the Ta surface in contact with the 2504 Blend. The height of the oxygen peak for the corresponding time for the 2500 Blend shows the Oxygen counts per second (c/s) to be about zero; much smaller than for the 2504 Blend which shows a c/s of about 0.25 for the Oxygen signal, indicating less tantalum oxidation for the 2500 Blend.

Example 5
SIMS Analysis of CVD Cu on Pt, Ni, and Ta Barrier Layers

Several samples were prepared, each having a barrier layer deposited on a substrate having a structured $SiO_2$ layer. The barrier layers were deposited to a thickness of about 200 Å. Three samples were prepared, having Pt, Ni, and Ta barrier layers, respectively. The barrier layers were fabricated as described in Example 2. The environment to which the barrier layers were exposed prior to CVD Cu was the same as previously described (The samples were placed in a box located in ambient atmospheric conditions at room temperature for approximately 2 days prior to CVD Cu deposition).

Cu was then deposited onto the barrier layers by CVD using the apparatus and general process parameters described with respect to previous examples and Cupra select 2504 Blend. The samples were then tested using both the scribe and blank conventional tape test methods, as described with respect to Example 1. The sample having a Ta barrier layer failed the tape test, while the sample having a Ni barrier layer and the sample having a Pt barrier layer passed the tape test.

Figure 7:
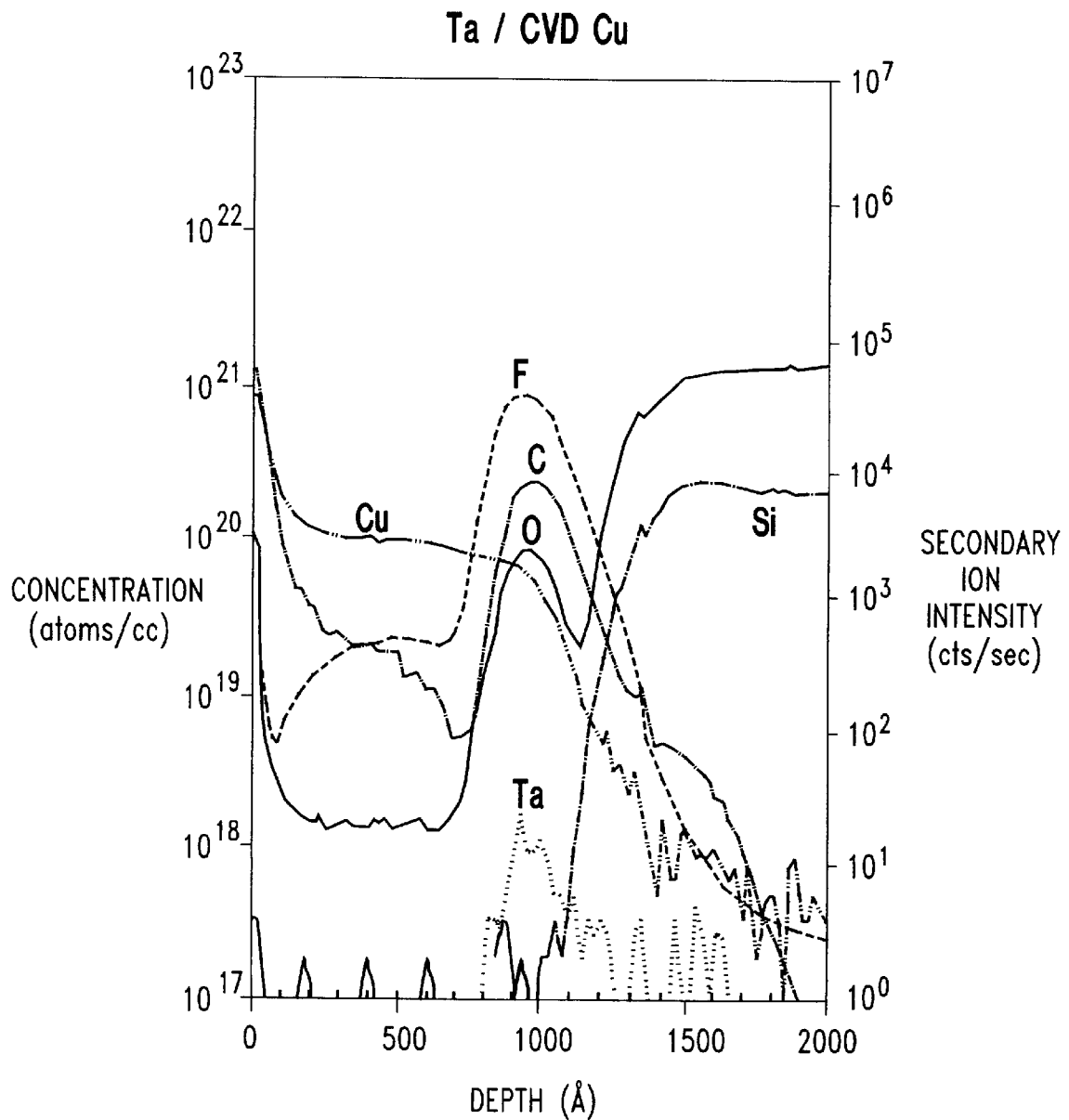
FIG. 7 shows a SIMS profile for a sample having a Ta barrier layer.
Figure 8:
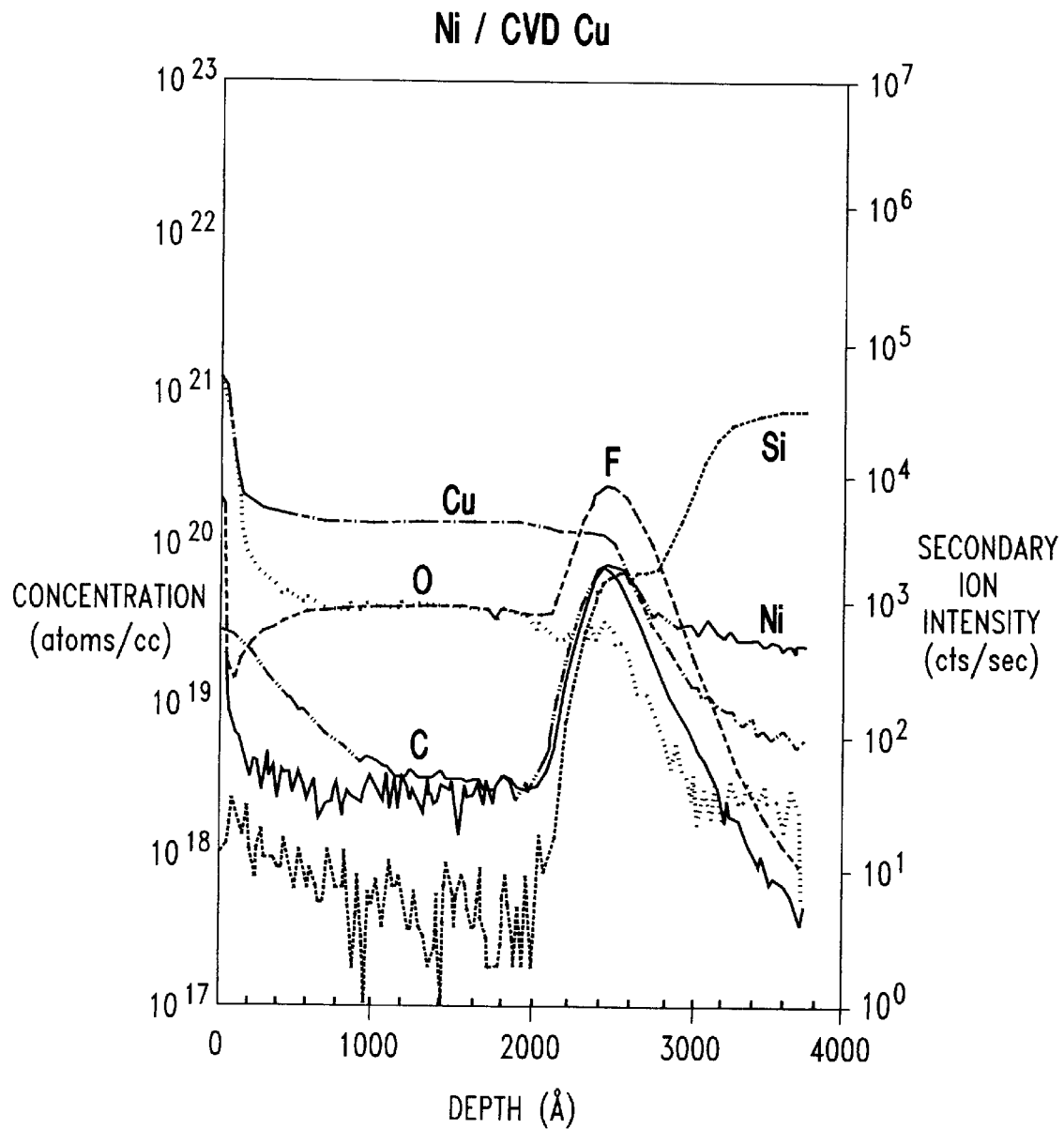
FIG. 8 shows a SIMS profile for a sample having a Ni barrier layer.
Figure 9:
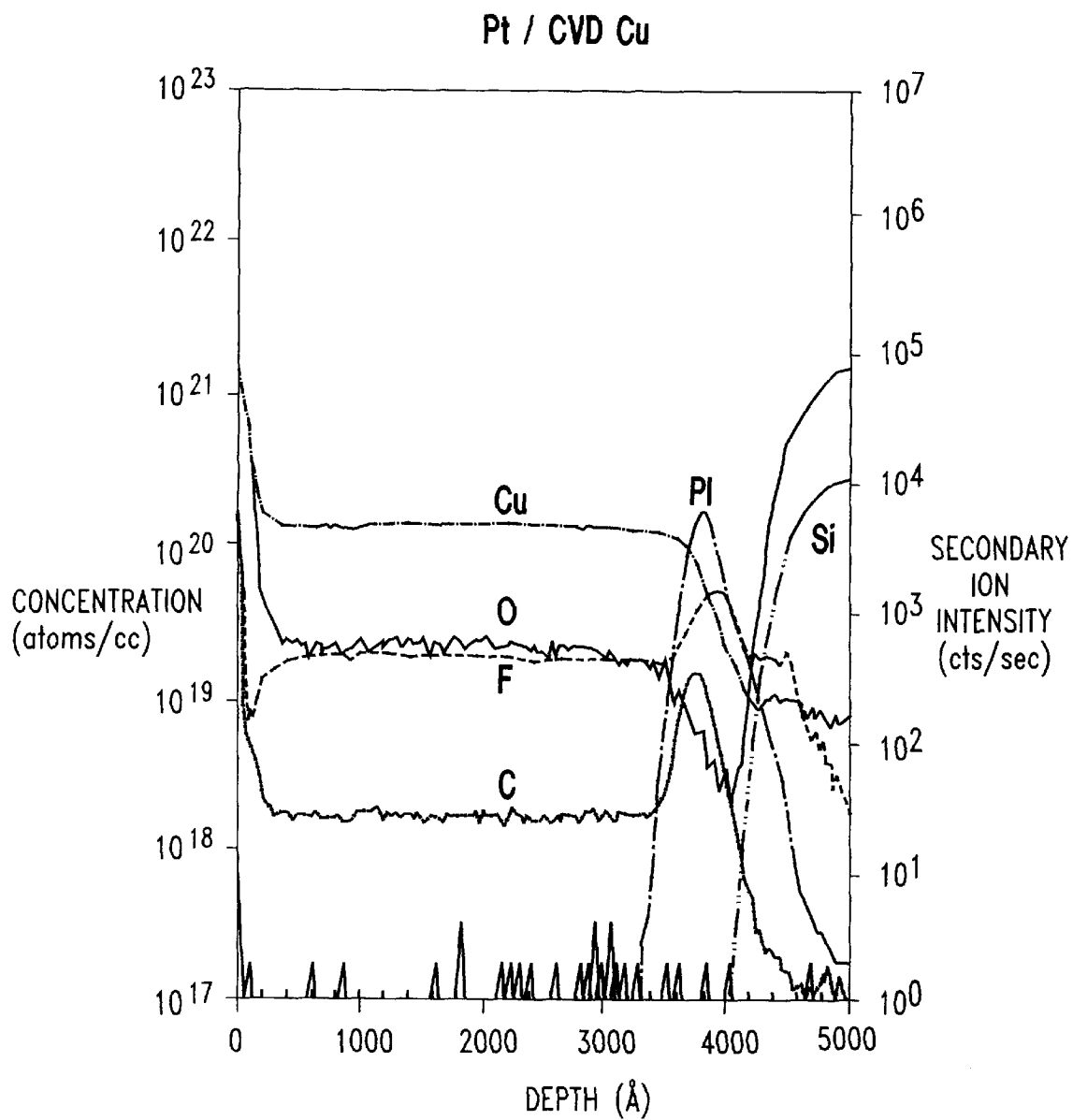
FIG. 9 shows a SIMS profile for a sample having a Pt barrier layer.

FIGS. 7, 8 and 9 show SIMS profiles for the samples having a Ta, Ni, and Pt barrier layer, respectively. The x axis represents position in a direction perpendicular to the plane of the barrier layer. The y axis represents the concentration of various elements, in atoms per cubic centimeter. Plots 710, 720, 730, 740, 750 and 760 of FIG. 7 show the concentration of Cu, fluorine, carbon, oxygen, silicon and Ta, respectively, for the sample having a Ta barrier layer. Plots 810, 820, 830, 840, 850 and 860 of FIG. 8 show the concentration of Cu, fluorine, carbon, oxygen, silicon and Ni, respectively, for the sample having a Ni barrier layer. Plots 910, 920, 930, 940, 950 and 960 of FIG. 9 show the concentration of Cu, fluorine, carbon, oxygen, silicon and Pt, respectively, for the sample having a Pt barrier layer.

The interface between the Cu and the barrier layer is located approximately at the peak in the fluorine and carbon concentrations, where the Cu concentration begins to drop off. The similarity in the fluorine and carbon profiles, i.e., compare plots 720, 820 and 920, for fluorine and plots 730, 830 and 930 for carbon, combined with the different tape test results, show that differences due to fluorine and carbon, either at the interface between the Cu and the barrier layer or in the Cu matrix, are probably not responsible for the superior adhesion of the samples having Pt and Ni barrier layers.

The sample having a Ta barrier layer shows an oxygen peak at the interface between the Cu and the Ta barrier layer, see FIG. 7, plot 740 of FIG. 7, suggesting that the Ta oxidized prior to or during the deposition of Cu. The samples having Ni and Pt barrier layers do not have a corresponding peak, see FIGS. 8 and 9, plots 840 and 940, respectively, suggesting that the Ni and Pt did not significantly oxidize prior to or during the deposition of Cu. According to the inventors' analysis, this difference in the oxidation of the barrier layer is responsible for the superior adhesion properties of the samples having Pt and Ni barrier layers, relative to the sample having a Ta barrier layer.

Example 6
X-TEM Analysis of CVD Cu Deposited on Ex-Situ Pt and Ni

Two samples were prepared, each having a barrier layer deposited on a substrate having a structured SiO$_2$ layer. The barrier layers were deposited to a thickness of about 200 Å. One sample had a Pt barrier layer, and the other had a Ni barrier layer. The barrier layers were fabricated as described in Example 2. The environment to which the barrier layers were exposed prior to CVD Cu was the same as previously described (The samples were placed in a box located in ambient atmospheric conditions at room temperature for approximately 2 days prior to CVD Cu deposition).

Cu was then deposited onto the barrier layers by CVD using the apparatus and general process parameters described with respect to previous examples and Cupra select 2504 Blend. The samples were then tested using both the scribe and blank conventional tape test methods, as described with respect to Example 1. All samples passed the tape testing.

The samples were cross-sectioned and examined using X-ray transmission electron microscopy (X-TEM). There was no visible oxide layer on the Pt barrier layer, and the interface between the Pt and Cu was well defined. Patches of oxide were observed on the surface of the Ni barrier layer. In the regions where there was no visible oxide, the interface between the Ni and Cu appeared sharp and well defined. Evidently the small scattered portion of the interface between Ni and Cu which exhibited visible oxide presence was inadequate to cause failure during the tape testing of this sample.

While the foregoing is directed to preferred embodiments of the present invention, other and further embodiments of the invention may be devised without departing from the basic scope thereof. The scope of the invention is determined by the claims which follow.

What is claimed is:

1. A method for depositing copper, comprising:

(a) providing a barrier layer having a first surface that is substantially unoxidized; and (b) depositing a first copper layer onto the first surface of the barrier layer, wherein the first copper layer is deposited from a precursor containing less than about 2,000 ppm water.

2. A method for depositing copper, comprising.

(a) providing a barrier layer having a first surface that is substantially unoxidized, wherein the first surface that is substantially unoxidized is provided by removing oxide from the first surface of the barrier layer, and wherein the oxide is removed using a process selected from the group consisting of ion bombardment, reactive cleaning by contact with a gas which reacts with the oxide to produce a volatile reaction product, and reactive cleaning by contact with a plasma species which reacts with the oxide to produce a volatile reaction product; and (b) depositing a first copper layer onto the first surface of the barrier layer.

3. A method for depositing layers onto a substrate, comprising:

(a) depositing a barrier layer onto a substrate; and (b) depositing a first copper layer by chemical vapor deposition (CVD) onto a first surface of the barrier layer, wherein the first copper layer is deposited from a precursor that contains less than about 2,000 ppm water.

* * * * *